United States Patent
Hirose et al.

(10) Patent No.: US 7,470,958 B2
(45) Date of Patent: Dec. 30, 2008

(54) SEMICONDUCTOR DEVICE

(75) Inventors: Yutaka Hirose, Kyoto (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 41 days.

(21) Appl. No.: 11/492,913

(22) Filed: Jul. 26, 2006

(65) Prior Publication Data

US 2007/0023779 A1   Feb. 1, 2007

(30) Foreign Application Priority Data

Jul. 28, 2005   (JP) ............... 2005-219286

(51) Int. Cl.
*H01L 23/62*   (2006.01)

(52) U.S. Cl. ............... 257/355; 257/173; 257/E29.246

(58) Field of Classification Search ............ None
See application file for complete search history.

(56) References Cited

U.S. PATENT DOCUMENTS

| | | | |
|---|---|---|---|
| 5,304,802 A * | 4/1994 | Kumagai | 257/328 |
| 5,543,999 A * | 8/1996 | Riley | 361/119 |
| 7,067,876 B2 * | 6/2006 | Yasuhara et al. | 257/335 |
| 7,173,288 B2 * | 2/2007 | Lee et al. | 257/94 |
| 2004/0222469 A1 * | 11/2004 | Asano et al. | 257/355 |
| 2005/0164482 A1 * | 7/2005 | Saxler | 438/604 |

FOREIGN PATENT DOCUMENTS

JP   60-10653   1/1985

* cited by examiner

*Primary Examiner*—Leonardo Andújar
*Assistant Examiner*—Fei Fei Yeung Lopez
(74) *Attorney, Agent, or Firm*—McDermott Will & Emery LLP (57) ABSTRACT

A semiconductor device includes a field effect transistor and a pn junction diode formed on a substrate. The field effect transistor has a source electrode, a drain electrode and a gate electrode formed on an element forming layer including a plurality of nitride semiconductor layers. The diode includes a p-type nitride semiconductor layer selectively formed on the element forming layer and an ohmic electrode, and has a pn junction formed between an n-type region of a two-dimensional electron gas generated on a heterojunction interface and a p-type region of the p-type nitride semiconductor layer. The diode is electrically connected to the gate electrode and forms a current path for allowing an excessive current caused in the gate electrode to pass.

10 Claims, 5 Drawing Sheets

SEMICONDUCTOR DEVICE

CROSS-REFERENCE TO RELATED APPLICATIONS

This application claims priority under 35 U.S.C. §119 on Patent Application No. 2005-219286 filed in Japan on Jul. 28, 2005, the entire contents of which are hereby incorporated by reference. The entire contents of Patent Application No. 2006-190019 filed in Japan on Jul. 11, 2006 are also incorporated by reference.

BACKGROUND OF THE INVENTION

The present invention relates to a semiconductor device, and more particularly, it relates to a semiconductor device including a field effect transistor using a nitride semiconductor and having a protection diode.

A group III-V nitride semiconductor is a compound semiconductor including aluminum (Al), boron (B), gallium (Ga) or indium (In) and nitrogen (N) and represented by a general formula, $B_wAl_xGa_yIn_zN$ (wherein $w+x+y+z=1$; and $0 \leq w, x, y, z \leq 1$).

A nitride semiconductor has various advantages such as a large band gap and a resultant high breakdown voltage, high electron saturation velocity, high electron mobility and a high electron density on a heterojunction, and therefore, it has been earnestly studied and developed for application to a short-wavelength light emitting device, a high-output high-frequency device, a high-frequency low-noise amplifying device or the like.

In particular, a heterojunction structure in which group III-V nitride semiconductor layers respectively having different composition ratios of group III-V elements and having different band gaps are stacked, or a quantum well structure or a superlattice structure in which a plurality of such group III-V nitride semiconductor layers are stacked is used as a basic structure of the aforementioned devices because the modulation degree of an electron density can be controlled within the device by employing such a structure.

One of semiconductor elements using the heterojunction structure is a heterojunction field effect transistor (HFET). An HFET is a rapidly operating element and is expected to be applied to a high-output device, a power switching device, a high-frequency power device, a high-frequency low-noise amplifier or the like.

Semiconductor devices are required to be reduced in size for faster operation, and an HFET used in such application is not an exception. An HFET using a nitride semiconductor has, however, restriction in surge resistance of a gate, and hence, there is a limit in the refinement of the gate. Also, in the application to a power switching device or the like, the surge resistance is required to be further improved.

In order to improve the surge resistance of an element in a conventional semiconductor device, a method in which a protection element is formed separately from the element is known (see, for example, Japanese Laid-Open Patent Publication No. 60-10653). Also, a protection circuit is conventionally formed as an external circuit.

However, in the conventional semiconductor device, since the protection circuit is externally formed or the protection element is separately formed for protecting the gate from a surge voltage, the area of the whole circuit or the element is disadvantageously increased. Also, in the case where the protection element is separately formed, it is necessary to perform a procedure for forming a diffusion layer to be formed into the protection element, which disadvantageously makes the fabrication complicated.

SUMMARY OF THE INVENTION

The present invention was devised to overcome the aforementioned conventional disadvantages and an object of the invention is realizing an HFET with high surge resistance by protecting a gate of the HFET using a nitride semiconductor from a surge voltage without externally forming a protection circuit and without making fabrication complicated.

In order to achieve the object, the semiconductor device of this invention includes a protection diode formed in the same nitride semiconductor layer as a field effect transistor and using a two-dimensional electron gas.

Specifically, the semiconductor device of this invention includes an element forming layer including a plurality of nitride semiconductor layers formed on a substrate and having a heterojunction interface; a field effect transistor having a source electrode, a drain electrode and a gate electrode and formed on the element forming layer; and a diode that includes a p-type nitride semiconductor layer selectively formed on the element forming layer and an ohmic electrode spaced from the p-type nitride semiconductor layer and formed on the element forming layer and has a pn junction formed between an n-type region of a two-dimensional electron gas generated on the heterojunction interface and a p-type region of the p-type nitride semiconductor layer, the diode is electrically connected to the gate electrode and forms a current path for allowing an excessive current caused in the gate electrode to pass.

In the semiconductor device of this invention, the gate electrode can be protected from an excessive current. Accordingly, the gate electrode can be reduced in size and an HFET with very high surge resistance can be formed. Also, since the pn junction is formed between the n-type region of the two-dimensional electron gas and the p-type region of the p-type semiconductor layer, the area occupied by the protection diode is very small. Accordingly, the increase in the area of the semiconductor device caused by providing a protection circuit can be suppressed. Furthermore, since the diode can be formed by forming a third nitride semiconductor layer and an ohmic electrode on the element forming layer, the number of process procedures is minimally increased by providing the protection circuit.

In the semiconductor device of this invention, the diode is preferably electrically connected between the gate electrode and the source electrode. Alternatively, the diode may be electrically connected between the gate electrode and the drain electrode or may be electrically connected between the gate electrode and ground.

The semiconductor device of this invention preferably further includes an isolation region formed on the substrate for separating the element forming layer into a plurality of element forming regions, and the field effect transistor and the diode are preferably formed in different element forming regions out of the plurality of element forming regions.

The semiconductor device of this invention, the diode is preferably plural in number, and at least two of the plural diodes are preferably electrically connected to each other in series.

The semiconductor device of this invention preferably further includes an isolation region formed on the substrate for separating the element forming layer into a plurality of element forming regions, and the field effect transistor and the plural diodes are preferably formed in different element forming regions out of the plurality of element forming regions. Thus, the surge resistance can be further improved.

In the semiconductor device of the invention, two of the plural diodes preferably form a diode pair with anodes thereof electrically connected to each other, and the diode pair preferably includes the anodes thereof electrically connected to each other made of the p-type nitride semiconductor layer that is one in number and the ohmic electrode that is two in number formed with the p-type nitride semiconductor layer sandwiched therebetween. Thus, the gate electrode can be protected no matter whether the surge voltage is positive or negative. Also, since the anode is shared between the diodes, the area occupied by the p-type nitride semiconductor layer can be small. Accordingly, the increase in the size caused by forming the diode can be further reduced. Moreover, the fabrication process can be simplified.

The semiconductor device of this invention preferably further includes an isolation region formed on the substrate for separating the element forming layer into a plurality of element forming regions, and the two diodes forming the diode pair are formed in one of the plurality of element forming regions. Thus, the area occupied by the diodes can be smaller than in the case where the diodes are independently formed.

In this case, the diode pair is preferably plural in number. Thus, the surge resistance can be further improved.

In the semiconductor device of this invention, the substrate preferably has a conducting property, and the semiconductor device preferably further includes a first via plug for electrically connecting the source electrode and the substrate to each other; and a second via plug for electrically connecting a diode connected to the gate electrode out of the plural diodes and the ohmic electrode of another diode disposed in an opposite end to each other. Alternatively, the substrate preferably has a conducting property, and the semiconductor device may further include a first via plug for electrically connecting the drain electrode and the substrate to each other; and a second via plug for electrically connecting a diode connected to the gate electrode out of the plural diodes and the ohmic electrode of another diode disposed in an opposite end to each other. Thus, the diode disposed in the end is electrically connected to the source electrode or the drain electrode through the substrate, and hence, interconnections can be easily formed. Also, the excessive current can be easily allowed to pass by grounding the substrate.

BRIEF DESCRIPTION OF THE DRAWINGS

FIGS. 1A and 1B are diagrams of a semiconductor device according to Embodiment 1 of the invention and specifically.

FIGS. 2A and 2B are diagrams of a semiconductor device according to a modification of Embodiment 1 of the invention and specifically.

FIGS. 3A and 3B are diagrams of a semiconductor device according to Embodiment 2 of the invention and specifically.

DETAILED DESCRIPTION OF THE INVENTION

Embodiment 1

Figure 1A:
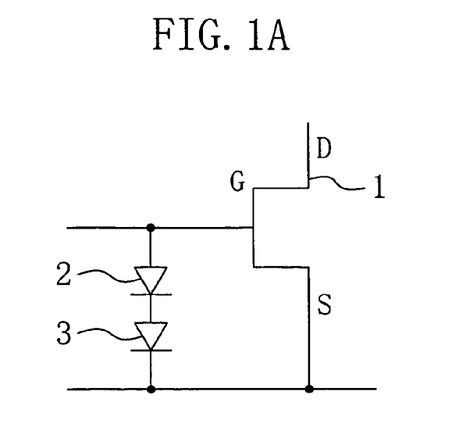
FIG. 1A is a circuit diagram thereof and FIG. 1B is a cross-sectional view thereof.
Figure 1B:
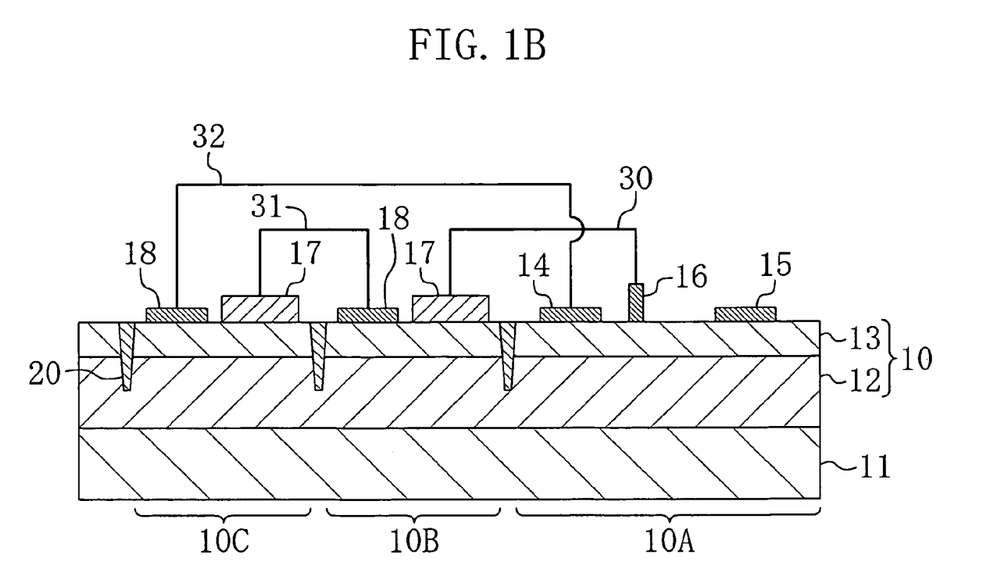

A semiconductor device according to Embodiment 1 of the invention will now be described with reference to FIGS. 1A and 1B. FIGS. 1A and 1B show the semiconductor device of Embodiment 1, and specifically, FIG. 1A is an equivalent circuit diagram thereof and FIG. 1B is a cross-sectional view thereof. As shown in FIGS. 1A and 1B, the semiconductor device of this embodiment includes a heterojunction field effect transistor (HFET) and a protection diode formed between the gate and the source of the HFET.

As shown in FIG. 1B, an element forming layer 10 including a first semiconductor layer 12 of GaN and a second semiconductor layer 13 of i-$Al_{0.26}Ga_{0.74}N$ successively stacked is formed on a substrate 11 of sapphire. A source electrode 14 and a drain electrode 15 corresponding to ohmic electrodes and spaced from each other are formed in a first region 10A on the element forming layer 10, and a gate electrode 16 is formed between these electrodes, so as to construct an HFET 1.

A third semiconductor layer 17 of p-type $Al_{0.26}Ga_{0.74}N$ and an ohmic electrode 18 spaced from each other are formed in a second region 10B separated from the first region 10A of the element forming layer 10 by an isolation region 20. In the case where the p-type third semiconductor layer 17 is thus formed on the element forming layer 10 having a heterojunction interface, a pn junction is formed between an n-type region of a two-dimensional electron gas (2DEG) generated on the heterojunction interface and a p-type region of the third semiconductor layer 17. Accordingly, when the ohmic electrode 18 is formed on the element forming layer 10, a first pn junction diode 2 having an anode of the third semiconductor layer 17 and a cathode of the ohmic electrode 18 is formed.

In this embodiment, a second pn junction diode 3 having the same structure as the first pn junction diode 2 is formed in a third region 10C separated from the second region 10B by another isolation region 20.

The third semiconductor layer 17 corresponding to the anode of the first pn junction diode 2 and the gate electrode 16 of the HFET 1 are electrically connected to each other through an interconnection 30. Also, the ohmic electrode 18 corresponding to the cathode of the first pn junction diode 2 and the third semiconductor layer 17 corresponding to the anode of the second pn junction diode 3 are electrically connected to each other through an interconnection 31, and the ohmic electrode 18 corresponding to the cathode of the second pn junction diode 3 and the source electrode 14 of the HFET 1 are electrically connected to each other through an interconnection 32. The third semiconductor layer 17 may be connected to the interconnections 30 and 31 by using an electrode (not shown) of platinum or the like formed on the third semiconductor layer 17.

In this manner, the first pn junction diode 2 and the second pn junction diode 3 are serially connected between the gate and the source of the HFET 1 as shown in FIG. 1A, so as to form a current path for allowing an excessive current applied to the gate electrode 16 to pass.

Since the first pn junction diode 2 and the second pn junction diode 3 thus connected between the gate and the source functions as a protection circuit, the surge resistance of the HFET 1 can be improved. Also, the first pn junction diode 2 and the second pn junction diode 3 are formed on the same substrate 11 with the HFET 1, and the size of the substrate is merely slightly increased by the diodes. Furthermore, in this embodiment, the first pn junction diode 2 and the second junction diode 3 are formed by using the p-type third semiconductor layer 17 and the ohmic electrode 18 formed in the region on the element forming layer 10 separated from the HFET 1 by the isolation region 20. Accordingly, as compared with general procedures for forming an HFET, merely a procedure for forming the p-type semiconductor layer alone is additionally performed, and hence, the protection elements can be formed by minimally increasing the number of procedures.

When the protection circuit including the protection elements of the pn junction diodes using the 2DEG thus formed is provided, the surge resistance of a general HFET with a gate length of 1 μm, which is conventionally approximately 300 V, can be improved to approximately 1 kV.

Although the diodes are connected between the gate and the source in this embodiment, they may be provided between the gate and the drain or between the gate and the ground in accordance with the configuration of the circuit or the target of the protection. Also, such arrangements can be combined. Furthermore, although the two diodes are serially connected in this embodiment, the number of diodes may be one, or three or more depending upon desired surge resistance. Also, a plurality of diodes may be connected in parallel.

The p-type third semiconductor layer 17 may be formed as follows: For example, after growing the element forming layer 10 on the substrate 11, p-type doped $Al_{0.26}Ga_{0.74}N$ is subsequently grown thereon. Then, after forming a resist mask for covering a region where the third semiconductor layer 17 is to be formed, dry etching is performed by using a chlorine-based etchant, so as to form the third semiconductor layer 17.

Alternatively, after growing the element forming layer 10, a silicon oxide ($SiO_2$) film is formed so as to cover a region excluding the region where the third semiconductor layer 17 is to be formed, and then, p-type doped $Al_{0.26}Ga_{0.74}N$ is regrown. When the third semiconductor layer 17 is formed by regrowing, a damage otherwise caused by etching can be advantageously avoided.

The material, the thickness and the impurity concentration of the third semiconductor layer 17 may be determined depending upon the desired surge resistance of the HFET. For example, in the case where surge resistance of 1 kV is desired to be attained with a general gate length of 1 μm, the first pn junction diode 2 and the second pn junction diode 3 may be formed by using $Al_{0.26}Ga_{0.74}N$ with a thickness of 150 nm and an impurity concentration of $3 \times 10^{18}$ $cm^{-3}$.

Modification of Embodiment 1

Figure 2A:
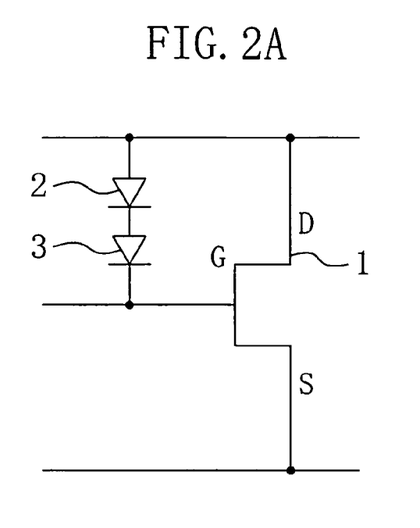
FIG. 2A is a circuit diagram thereof and FIG. 2B is a cross-sectional view thereof.
Figure 2B:
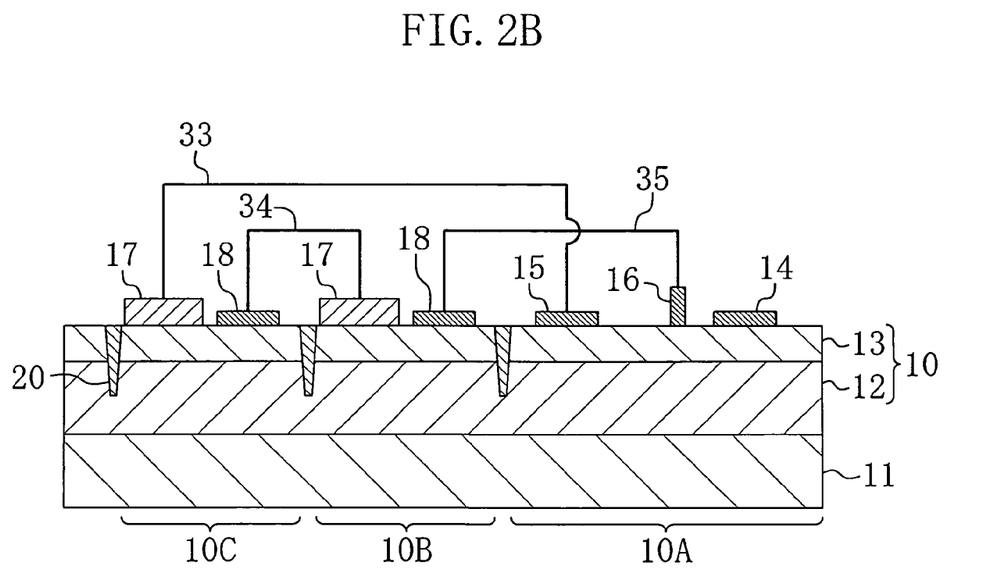

Now, a modification of Embodiment 1 of the invention will be described with reference to the accompanying drawings. FIGS. 2A and 2B show a semiconductor device according to the modification of Embodiment 1, and specifically, FIG. 2A is an equivalent circuit diagram thereof and FIG. 2B is a cross-sectional view thereof. In FIGS. 2A and 2B, like reference numerals are used to refer to like elements shown in FIGS. 1A and 1B so as to omit the description.

As shown in FIGS. 2A and 2B, protection diodes are connected between a gate and a drain in the semiconductor device of this modification. A drain electrode 15 of an HFET 1 and a third semiconductor layer 17 corresponding to an anode of a first pn junction diode 2 are connected to each other through an interconnection 33. An ohmic electrode 18 corresponding to a cathode of the first pn junction diode 2 and the third semiconductor layer 17 corresponding to an anode of a second pn junction diode 3 are connected to each other through an interconnection 34. The ohmic electrode 18 corresponding to a cathode of the second pn junction diode 3 and a gate electrode 16 of the HFET 1 are connected to each other through an interconnection 35.

When the protection diodes are connected between the drain and the gate in this manner, the HFET can be protected from an excessive current passing through its drain.

Although the two diodes are serially connected in this modification, the number of diodes may be one, or three or more depending upon desired surge resistance. Also, the diodes may be connected in parallel.

Embodiment 2

Figure 3A:
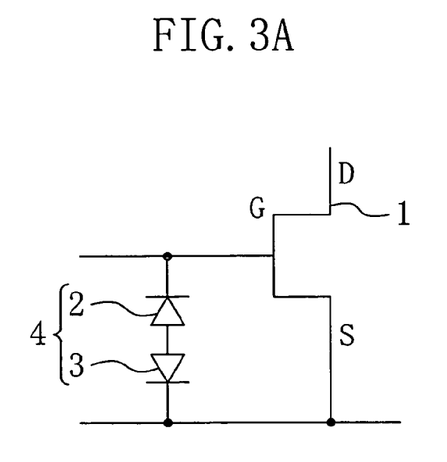
FIG. 3A is a circuit diagram thereof and FIG. 3B is a cross-sectional view thereof.
Figure 3B:
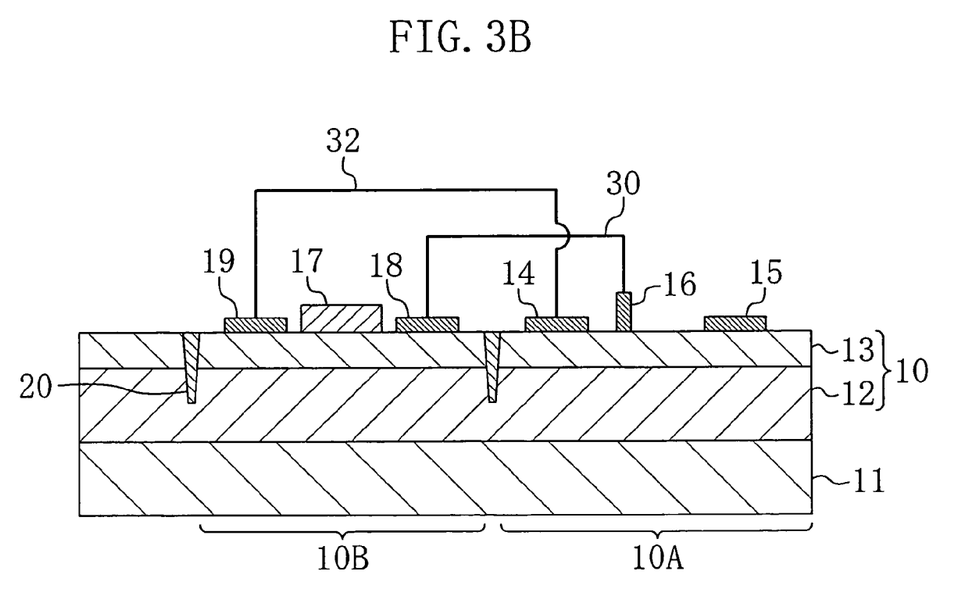

Embodiment 2 of the invention will now be described with reference to the accompanying drawings. FIGS. 3A and 3B show a semiconductor device of Embodiment 2, and specifically, FIG. 3A is an equivalent circuit diagram thereof and FIG. 3B is a cross-sectional view thereof. In FIGS. 3A and 3B, like reference numerals are used to refer to like elements shown in FIGS. 1A and 1B so as to omit the description.

As shown in FIGS. 3A and 3B, the semiconductor device of this embodiment includes an HFET 1 and a diode pair 4 composed of two diodes connected between the gate and the source of the HFET 1 and having a common anode.

As shown in FIG. 3B, an ohmic electrode 18 and another ohmic electrode 19 spaced from each other are formed in a second region 10B separated by an isolation region 20 from a first region 10A of an element forming layer 10 where the HFET 1 is formed, and a third semiconductor layer 17 of p-type $Al_{0.26}Ga_{0.74}N$ is formed between the ohmic electrode 18 and the ohmic electrode 19.

A depletion layer extends in a portion of the element forming layer 10 below the third semiconductor layer 17. Accordingly, a first pn junction diode 2 having a cathode of the ohmic electrode 18 and an anode of the third semiconductor layer 17 and a second pn junction diode 3 having a cathode of the ohmic electrode 19 and an anode of the third semiconductor layer 17 are formed. Therefore, there is no need to provide an isolation region for separating the first pn junction diode 2 and the second pn junction diode 3 from each other.

The ohmic electrode 18 of the first pn junction diode 2 and a gate electrode 16 of the HFET 1 are electrically connected to each other through an interconnection 30, and the ohmic electrode 19 of the second pn junction diode 3 and a source electrode 14 are electrically connected to each other through an interconnection 32. Accordingly, the two pn junction diodes facing the opposite directions are serially connected between the gate and the source of the HFET 1.

When the two diodes facing the opposite directions are serially connected between the gate and the source in this manner, the gate can be protected no matter whether a positive or negative surge voltage is caused.

Furthermore, although three isolation regions should be generally formed for forming two diodes, the number of isolation regions can be reduced by one, and hence, the area occupied by the elements can be further reduced.

Figure 4:
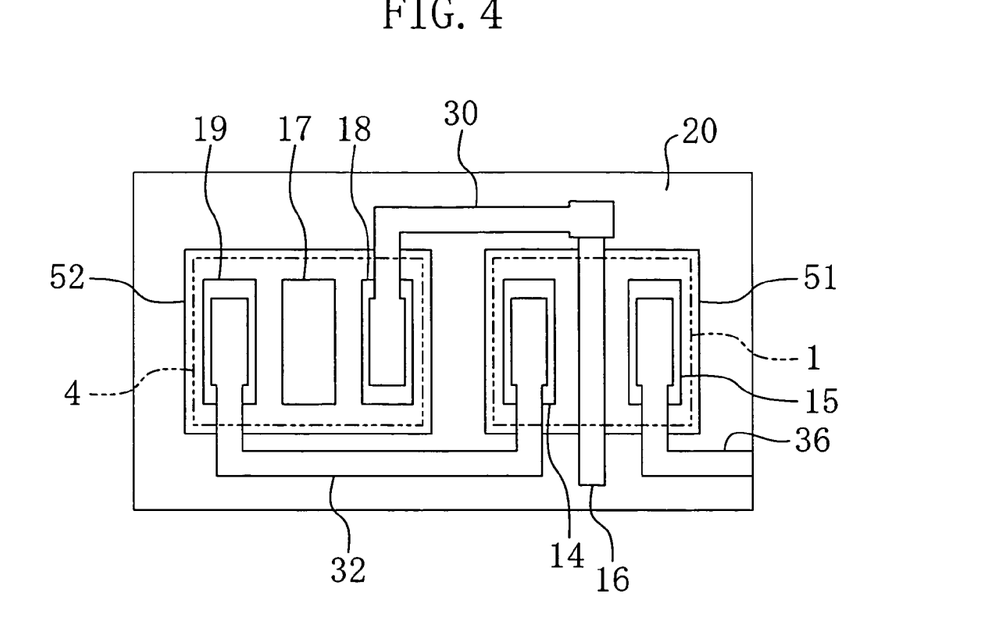
FIG. 4 is a plan view for showing the layout of the semiconductor device of Embodiment 2 of the invention.

FIG. 4 shows an example of the layout of the semiconductor device of this embodiment. A first element forming region 51 and a second element forming region 52 separated from each other by an isolation region 20 are formed on a substrate 11. The HFET 1 is formed in the first element forming region 51, and the diode pair 4 composed of the first pn junction diode 2 and the second pn junction diode 3 is formed in the second element forming region 52. Furthermore, an interconnection 36 for connecting the drain electrode 15 of the HFET 1 to a power line, the interconnection 30 for connecting the gate electrode 16 to the ohmic electrode 18 corresponding to the cathode of the first pn junction diode 2, and the interconnection 32 for connecting the source electrode 14 to the ohmic electrode 19 corresponding to the cathode of the second pn junction diode 3 are formed. Each of the interconnections 30, 32 and 36 is actually made of an interconnect layer buried in an interlayer insulating film covering the elements and a plug for connecting the interconnect layer and the corresponding electrode to each other.

Figure 5:
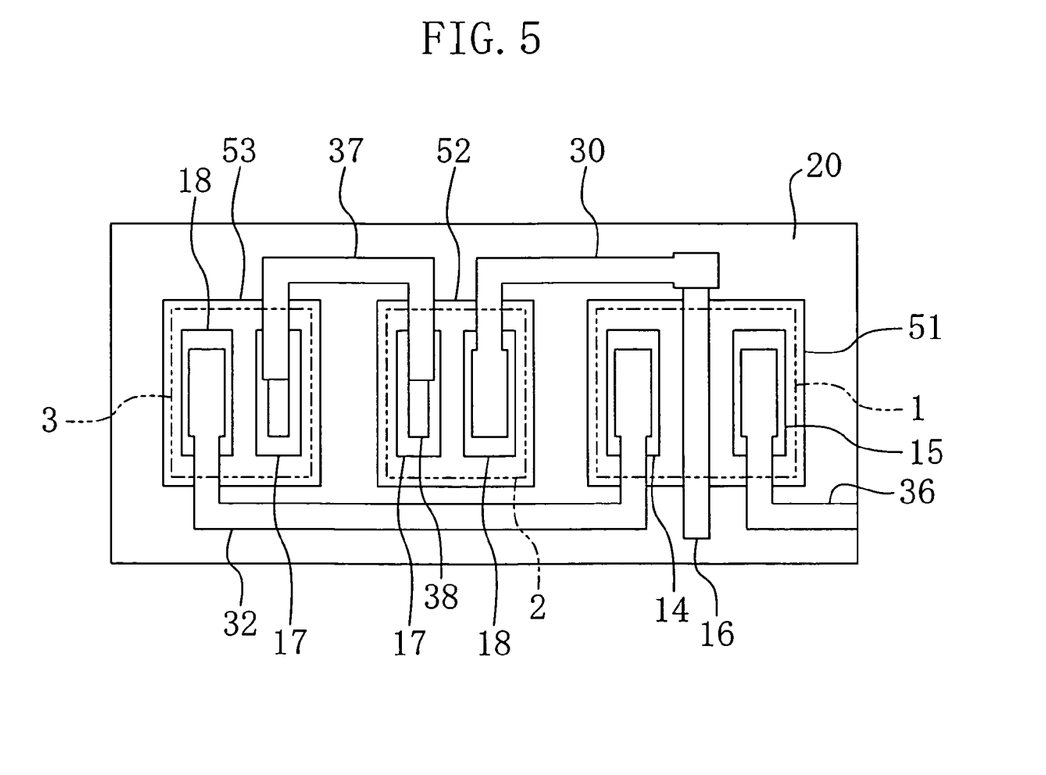
FIG. 5 is a plan view for showing the layout of a semiconductor device provided with no diode pair.

FIG. 5 shows an example of the layout where the first pn junction diode 2 is formed in the second element forming region 52 and the second pn junction diode 3 is formed in a third element forming region 53. As compared with the case where the two pn junction diodes are formed as a diode pair, the area occupied by the isolation region 20 and the third semiconductor layer 17 is increased. Also, it is necessary to form an anode connecting line 37 for connecting the anode of the first pn junction diode 2 and the anode of the second pn junction diode 3 to each other. Moreover, it is also necessary to form an anode electrode 38 of platinum or the like on the third semiconductor layer 17 for connecting the anode connecting line 37 to the third semiconductor layer 17.

In this manner, when the first pn junction diode 2 and the second pn junction diode 3 are formed as the diode pair 4 as in the semiconductor device of this embodiment, the number of element forming regions where the diodes are formed can be one, and the number of interconnections can be reduced. Therefore, the area occupied by the semiconductor elements can be reduced by approximately 20%. Furthermore, there is no need to form an electrode on the third semiconductor layer 17, and hence, the fabrication process can be simplified.

Although one diode pair alone having a common anode is connected between the gate and the source in this embodiment, two or more diode pairs may be connected instead. Also, a combination of a diode pair and a single diode may be provided instead.

Modification of Embodiment 2

Figure 6:
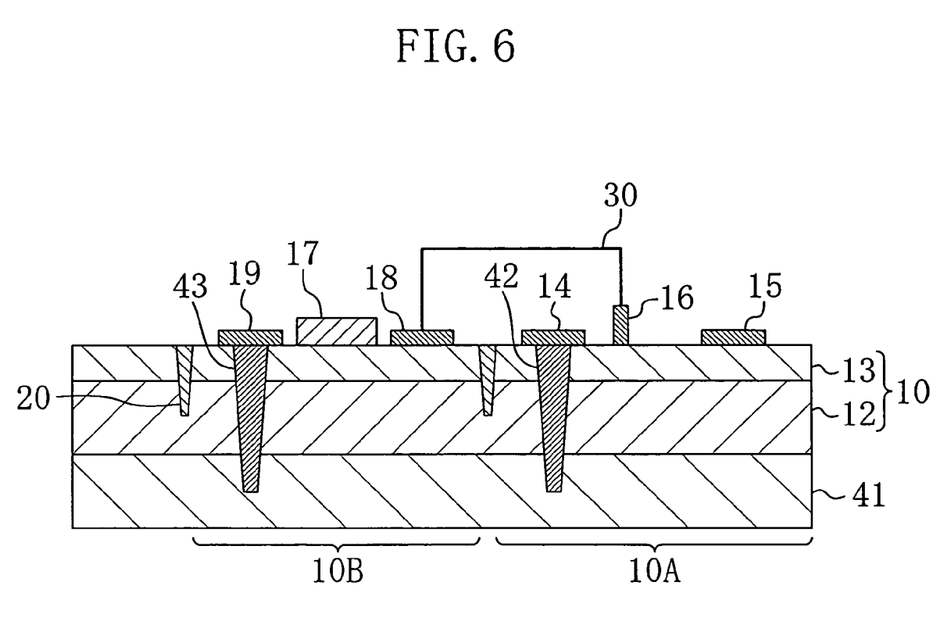
FIG. 6 is a cross-sectional view of a semiconductor device according to a modification of Embodiment 2 of the invention.

Now, a modification of Embodiment 2 of the invention will be described with reference to the accompanying drawing. FIG. 6 shows the cross-sectional structure of a semiconductor device according to the modification of Embodiment 2. In FIG. 6, like reference numerals are used to refer to like elements shown in FIGS. 3A and 3B.

The equivalent circuit of the semiconductor device of this modification is the same as that of the semiconductor device of Embodiment 2, and specifically, two diodes working as protection elements are connected between the gate and the source of an HFET in a back to back manner. As shown in FIG. 6, the semiconductor device of this modification is formed on a conducting substrate 41, and a via plug 42 for electrically connecting a source electrode 14 of the HFET and the substrate 41 to each other and a via plug 43 for electrically connecting an ohmic electrode 19 of a second pn junction diode 3 and the substrate 41 to each other are formed. Thus, there is no need to provide an interconnection 32 for electrically connecting the ohmic electrode 19 of the second pn junction diode 3 and the source electrode 14 of the HFET 1 to each other.

The conducting substrate 41 may be a silicon substrate or a substrate of silicon carbide. Also, each of the via plugs 42 and 43 may be made of a general material, and for example, may be formed by burying a layered material of titanium and gold.

Although the via plugs are provided in the semiconductor device of Embodiment 2 in this modification, the structure of this modification can be applied to the semiconductor device of Embodiment 1.

In each of the aforementioned embodiments and modifications, the third semiconductor layer 17 is made of a nitride semiconductor having the same aluminum composition ratio as the second semiconductor layer 13, but the third semiconductor layer 17 may be made of a nitride semiconductor having a different mixed crystal ratio from the second semiconductor layer 13 as far as it is a p-type.

The compositions of the first semiconductor layer 12 and the second semiconductor layer 13 are any of two kinds of nitride semiconductors having different band gaps selected from nitride semiconductors represented by a general formula of $B_wAl_xGa_yIn_zN$ (wherein $w+x+y+z=1$; and $0 \leq w, x, y, z \leq 1$) as far as a two-dimensional electron gas can be generated on the interface between the first semiconductor layer 12 and the second semiconductor layer 13.

Each of the electrodes may be made of a general material, and for example, the source electrode and the drain electrode may be made of a layered material of titanium and aluminum, a layered material of titanium, platinum and gold, or the like. Also, the gate electrode and the p-type ohmic electrode may be made of, for example, palladium, palladium silicon, nickel, a layered material of nickel and gold, a layered material of palladium, platinum and gold, or the like.

As described so far, the semiconductor device of this invention has an effect to protect a gate of an HFET using a nitride semiconductor from a surge voltage without externally providing a protection circuit and without complicating the fabrication process, so as to realize an HFET with high surge resistance. Therefore, the invention is useful, for example, as a field effect transistor or the like using a nitride semiconductor and having a protection diode.

What is claimed is:

1. A semiconductor device comprising:
   an element forming layer including a plurality of nitride semiconductor layers formed on a substrate and having a heterojunction interface;
   a field effect transistor having a source electrode, a drain electrode and a gate electrode and formed on said element forming layer; and
   plural diodes that include a p-type nitride semiconductor layer selectively formed on said element forming layer and an ohmic electrode spaced from said p-type nitride semiconductor layer and formed on said element forming layer and have a pn junction formed between an n-type region of a two-dimensional electron gas generated on said heterojunction interface and a p-type region of said p-type nitride semiconductor layer,
   wherein at least two of said plural diodes are electrically connected to each other in series and form a diode pair with anodes thereof electrically connected to each other,
   said diode pair includes said p-type nitride semiconductor layer that is one in number and is a common anode of said two diodes, and said ohmic electrode that is two in number formed with said p-type nitride semiconductor layer sandwiched therebetween,
   said two ohmic electrodes are formed on the element forming layer in different regions opposite to each other with said p-type nitride semiconductor layer sandwiched therebetween, and
   one of said ohmic electrodes is electrically connected to said gate electrode and forms a current path for allowing an excessive current caused in said gate electrode to pass.

2. The semiconductor device of claim 1,
   wherein said diode is electrically connected between said gate electrode and said source electrode.

3. The semiconductor device of claim 1,
   wherein said diode is electrically connected between said gate electrode and said drain electrode.

4. The semiconductor device of claim 1,
wherein said diode is electrically connected between said gate electrode and ground.

5. The semiconductor device of claim 1, further comprising an isolation region formed on said substrate for separating said element forming layer into a plurality of element forming regions,
wherein said field effect transistor and said diode are formed in different element forming regions out of said plurality of element forming regions.

6. The semiconductor device of claim 1, further comprising an isolation region formed on said substrate for separating said element forming layer into a plurality of element forming regions,
wherein said field effect transistor and said plural diodes are formed in different element forming regions out of said plurality of element forming regions.

7. The semiconductor device of claim 1, further comprising an isolation region formed on said substrate for separating said element forming layer into a plurality of element forming regions,
wherein said two diodes forming said diode pair are formed in one of said plurality of element forming regions.

8. The semiconductor device of claim 1, wherein said diode pair is plural in number.

9. The semiconductor device of claim 1, wherein said substrate has a conducting property, and
said semiconductor device further comprises:
a first via plug for electrically connecting said source electrode and said substrate to each other; and
a second via plug for electrically connecting a diode connected to said gate electrode out of said plural diodes and said ohmic electrode of another diode disposed in an opposite end to each other.

10. The semiconductor device of claim 1,
wherein said substrate has a conducting property, and
said semiconductor device further comprises:
a first via plug for electrically connecting said drain electrode and said substrate to each other; and
a second via plug for electrically connecting a diode connected to said gate electrode out of said plural diodes and said ohmic electrode of another diode disposed in an opposite end to each other.

* * * * *